United States Patent
Shih et al.

[11] Patent Number: 6,037,213
[45] Date of Patent: Mar. 14, 2000

[54] METHOD FOR MAKING CYLINDER-SHAPED CAPACITORS FOR DYNAMIC RANDOM ACCESS MEMORY

[75] Inventors: Cheng-Yeh Shih, Hsin-Chu; Cheng-Ming Wu, Kao-Hsiung; Yu-Hua Lee, Hsinchu, all of Taiwan

[73] Assignee: Taiwan Semiconductor Manufacturing Company, Ltd., Hsin-Chu, Taiwan

[21] Appl. No.: 09/089,550

[22] Filed: Jun. 3, 1998

[51] Int. Cl.[7] .............................................. H01L 21/8242
[52] U.S. Cl. ..................... 438/253; 438/254; 438/396; 438/397; 438/634; 438/638; 438/740
[58] Field of Search .................................. 438/238, 239, 438/253, 254, 255, 381, 396, 397, 399, 634, 637, 638, 640, 701, 740

[56] References Cited

U.S. PATENT DOCUMENTS

| | | | |
|---|---|---|---|
| 5,364,809 | 11/1994 | Kwon et al. | 437/52 |
| 5,453,633 | 9/1995 | Yun | 257/306 |
| 5,552,334 | 9/1996 | Tseng | 437/52 |
| 5,798,289 | 8/1999 | Ajika et al. | 438/239 |
| 5,817,555 | 10/1998 | Cho | 438/253 |
| 5,851,876 | 12/1998 | Jenq | 438/253 |
| 5,872,041 | 2/1999 | Lee et al. | 438/397 |
| 5,981,334 | 11/1999 | Chien et al. | 438/253 |

*Primary Examiner*—Mary Wilczewski
*Assistant Examiner*—Toniae M. Thomas
*Attorney, Agent, or Firm*—George O. Saile; Stephen B. Ackerman

[57] ABSTRACT

A method for making cylinder-shaped stacked capacitors for DRAMs is described. A planar first insulating layer is formed over device areas. An etch-stop layer, a second insulating layer, and a polish-back endpoint detect layer are deposited in which cylinder-shaped capacitors with node contacts are formed. First openings for node contacts are etched in the polish-back and second insulating layers to the etch-stop layer aligned over the device areas. Wider second openings, aligned over the first openings, are etched through the polish-back layer, and also removes the etch-stop layer in the first openings. The second insulating layer in the second openings is etched to the etch-stop layer, while the first insulating layer is etched in the first openings for node contact openings. A doped first polysilicon layer is deposited and polished back to the polish-back detect layer to form concurrently the node contacts in the first openings and bottom electrodes in the second openings. The second insulating layer is removed by a wet etch. A thin dielectric layer is deposited, and top electrodes are formed from a second polysilicon layer. The etch-stop layer provides better control of the etching depth for the first and second openings that improves reliability while providing a simple manufacturing process.

20 Claims, 3 Drawing Sheets

METHOD FOR MAKING CYLINDER-SHAPED CAPACITORS FOR DYNAMIC RANDOM ACCESS MEMORY

BACKGROUND OF THE INVENTION (1) Field of the Invention

The present invention relates to the fabrication of dynamic random access memory (DRAM) devices, and more particularly to a method for fabricating cylinder-shaped stacked capacitors for DRAM cells using an improved semiconductor process.

(2) Description of the Prior Art

Ultra Large Scale Integration (ULSI) technologies have dramatically increased the circuit density on the semiconductor chip. This increase in density is due in part to advances in high-resolution photolithography and anisotropic plasma etching in which the directional ion etching results in essentially bias-free replication of the photoresist image in the underlying patterned layers, such as in polysilicon and insulating oxide layers and the like.

One such circuit type where this high-resolution processing is of particular importance is the dynamic random access memory (DRAM) circuit. This DRAM circuit is used extensively in the electronics industry, and particularly in the computer industry for electrical data storage. The DRAM circuits consist of an array of individual memory cells, each cell consisting of an access transistor, usually a field effect transistor (FET), and a single storage capacitor. Information is stored on the cell as charge on the capacitor, which represents a unit of data (bit), and is accessed by read/write circuits on the periphery of the chip. By the year 2000 the number of these cells on a DRAM chip is expected to exceed a gigabit. To achieve this high density and still maintain a reasonable chip size, the individual cells on the chip must be significantly reduced in size. As these individual memory cells decrease in size, so must the area on the cell that the storage capacitor occupies. The reduction in the storage capacitor size makes it difficult to store sufficient charge on the capacitor to maintain an acceptable signal-to-noise level, and circuits require shorter refresh cycle times to retain the necessary charge level. One method of overcoming this size problem is to build stacked capacitors that extend vertically over the cell areas to increase the electrode capacitor area while confining the capacitor within the cell area.

However, as the minimum feature sizes decrease to less than a half-micrometer (um), it becomes increasingly difficult to build reliable stacked capacitors without increasing process complexity and manufacturing cost.

Numerous methods of making DRAM circuits with stacked capacitors having increased capacitance have been reported in the literature. The following U.S. patents describe several methods for making stacked capacitors. Kwon et al. in U.S. Pat. No. 5,364,809 describe a method for making a multichamber capacitor using a series of conducting sidewalls in a multiplicity of concave areas. Another approach is described by Yun in U.S. Pat. No. 5,453,633 in which node contact openings are etched through a relatively thick multilayer composed of silicon oxide and polysilicon, in which the top silicon oxide layer is patterned. A conformal polysilicon layer is deposited and etched back to form the capacitor bottom electrodes having a double-cylindrical shape. A simple method of forming Y-shaped capacitors in a DRAM cell is described by Tseng, U.S. Pat. No. 5,552,334 in which a relatively thick planar insulator is partially etched over the node contact areas using first openings in a photoresist mask and a timed etch. The openings in the photoresist mask are then recessed laterally to from larger second openings and the insulating layer is etched until the first openings are etched to the node contact areas on the substrate. The capacitor bottom electrodes and node contacts are then formed by depositing a single polysilicon layer which is eventually etched back to form bottom electrodes. However, it is difficult to achieve a reliable and repeatable manufacturing process using a timed etch.

Therefore, there is still a need to fabricate DRAM cells using processes which are simple and provide more accurate etching, and which avoid the complication of etching deep node contact openings that can result in unwanted residues and unopened node contacts.

SUMMARY OF THE INVENTION

It is a principal object of the present invention to provide a method for making DRAM memory cells with improved cylinder-shaped stacked capacitors having increased capacitance.

It is another object of this invention to provide a more controllable etch process using an etch-stop layer and a polish-back endpoint detect layer for making more reliable cylinder-shaped stacked capacitors.

It is still another object of this invention to provide these improved cylinder-shaped stacked capacitors without forming separate polysilicon-plug node contacts. This provides a more cost-effective manufacturing process.

The invention begins by providing a semiconductor substrate (wafer) composed of single crystalline silicon. A field oxide (FOX) is formed on the substrate surrounding and electrically isolating an array of device areas in which are formed the charge pass field effect transistors (FETs) for the DRAM cells. The field oxide is typically formed by the LOCal Oxidation of Silicon (LOCOS) in which an oxidation barrier layer, composed of silicon nitride ($Si_3N_4$), is used to mask the device areas and the exposed field oxide areas on the substrate are then thermally oxidized to form the FOX. After removing the silicon nitride, a charge passing field effect transistor (FET) is formed in each of the device areas. The FETs are formed by growing a thin gate oxide on the device areas, and then a conductively doped polysilicon layer and a silicide layer are deposited and patterned to form polycide FET gate electrodes extending over a portion of the device areas, concurrently the patterned polycide layer also serves as interconnecting word lines over the field oxide areas providing the interconnections between the FETs gate electrodes and the peripheral address circuits on the DRAM chip. Lightly doped drains (LDDs) are formed in the substrate adjacent to the gate electrodes, usually by ion implantation and then a sidewall spacer is formed on the gate electrodes by depositing and blanket etching back an insulating layer, such as $SiO_2$. After the LDDs and sidewall spacers are formed, the pass FETs are completed by forming source/drain contact regions on each side of the FET gate electrode adjacent to the sidewall spacer.

Continuing with the process, the improved cylinder shaped capacitors are now formed by depositing a first insulating layer on the substrate, which is then planarized. The first insulating layer is a silicon oxide ($SiO_2$) or a doped oxide such as a borophosphosilicate glass (BPSG). An etch-stop layer, preferably composed of silicon nitride ($Si_3N_4$), is then deposited on the first insulating layer, and a second insulating layer, also composed of a $SiO_2$ or BPSG, is deposited on the etch-stop layer. Next, a polish-back endpoint detect layer, composed of $Si_3N_4$, is deposited on the second insulating layer.

A photoresist mask and anisotropic plasma etching is then used to form first openings in the polish-back endpoint detect layer and in the second insulating layer using the etch-stop layer to accurately control the etch depth. The first openings are aligned over one of the source/drain regions in each of the device areas where the capacitor node contact openings are desired. Using a second photoresist mask and anisotropic plasma etching, second openings, that are aligned over and are wider than the first openings, are selectively etched in the exposed polish-back endpoint detect layer, and concurrently the etch-stop layer is removed in the first openings down to the first insulating layer. Then the second insulating layer exposed in the second openings is accurately etched to the etch-stop layer, while concurrently the first insulating layer is etched in the first openings to the device areas to complete the capacitor node contact openings to the source/drain regions. A conformal first polysilicon layer, which is conductively doped, is deposited over and in the second and first openings, and concurrently forms capacitor node contacts in the first openings and bottom electrodes having vertical sidewalls in the second openings for the cylinder-shaped capacitors. The first polysilicon layer is then chemically/mechanically polished to the polish-back endpoint detect layer. The polish-back endpoint detect layer is optional, but is preferred to prevent overpolishing and forming sharp corners in the patterned polysilicon that can otherwise result in higher leakage currents between the capacitor bottom and top electrodes. The polish-back endpoint detect layer, when used, can be selectively removed using a hot phosphoric acid ($H_3PO_4$) etch. Next the second insulating layer is removed by isotropic etching in a hydrofluoric (HF) acid etch to form an array of freestanding polysilicon bottom electrodes. Since the conformal first polysilicon layer does not completely fill the first openings (node contact openings), the capacitor surface area is further increased. The array of capacitors is now completed by depositing a thin interelectrode dielectric layer, having a high dielectric constant over the capacitor bottom electrodes. A second polysilicon layer is then deposited and patterned to form the top electrodes on the cylinder-shaped stacked capacitors.

BRIEF DESCRIPTION OF THE DRAWINGS

The objects and other advantages of this invention are best understood in the preferred embodiment with reference to the attached drawings, which are now briefly described.

DESCRIPTION OF THE PREFERRED EMBODIMENTS

Now in keeping with the objects of the invention, the method for forming the cylinder-shaped storage capacitor is covered in detail. This improved capacitor can be fabricated using FET structures that are currently utilized in the manufacture of DRAMs. Therefore, only those details of the underlying substrate structure will be described that are necessary for understanding of the current invention. It should also be well understood by those skilled in the art that by including additional processing steps, other types of devices can also be included on the DRAM chip. For example, by providing N and P doped wells, both P-channel and N-channel FETs can be formed for fabricating CMOS circuits, as are commonly used in the peripheral circuits of the chip.

Figure 1:
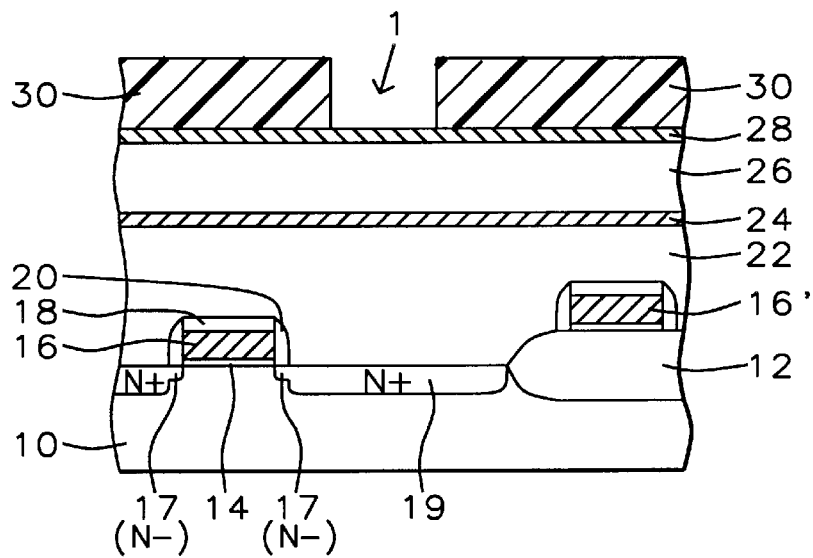
FIGS. 1 through 8 are schematic cross-sectional views through one of the memory cells of the array of DRAM cells depicting the sequence of process steps for forming the improved cylinder-shaped stacked capacitors by the method of this invention.

Referring now to FIG. 1, a cross-sectional view is shown of a portion of a substrate 10 having a partially completed DRAM cell. The preferred substrate is composed of a P-type single-crystal silicon with a <100> crystallographic orientation. A relatively thick Field OXide 12 (FOX) is used to surround and electrically isolate the device areas. Only a portion of the FOX is shown in FIG. 1. The method commonly practiced in the industry to form the field oxide 12 is the LOCal Oxidation of Silicon (LOCOS) method in which a thin thermal stress-release oxide (pad oxide) is deposited, and a thicker silicon nitride layer is deposited as a barrier layer to thermal oxidation over the device areas. The oxide/nitride layer is formed on the substrate, and conventional photolithographic techniques and plasma etching are used to etch openings in the oxide/nitride layer where the FOX is desired. The field oxide is then thermally grown, typically to a thickness of about 1500 to 5000 Angstroms.

The field effect transistors (FETs) are then fabricated in and on the device areas after removing the silicon nitride layer and pad oxide using a wet etch. For example, a heated solution of phosphoric acid ($H_3PO_4$) at a temperature of about 150° C. is used to remove the silicon nitride, and a dilute hydrofluoric (HF) acid solution is used to remove the pad oxide. For the DRAM cell, the typical transistor used is the N-channel FET and is now briefly described. The silicon surface is first carefully cleaned, and a good quality thermal oxide is grown to form the gate oxide 14. Only a portion of the gate oxide 14 remains under the gate electrodes 16, as shown in FIG. 1, during further processing. Typically the gate oxide is grown to a thickness of between about 30 and 150 Angstroms. The gate electrodes 16 are formed next from a patterned polycide (polysilicon and silicide) layer. The polycide layer is composed of a doped polysilicon layer and a refractory metal silicide on top of the polysilicon to further improve the electrical conductivity. This polycide layer is depicted in FIG. 1 as a single layer 16. The polysilicon is typically deposited by low-pressure chemical vapor deposition (LPCVD) using, for example, silane ($SiH_4$) as the reactant gas. The polysilicon is then appropriately doped by ion implantation to increase the electrical conductivity, and usually is doped with arsenic (As) or phosphorus (P) having a dopant concentration of between about 1.0 E 19 to 1.0 E 21 atoms/cm$^3$. The silicide is typically a refractory metal silicide, such as tungsten silicide ($WSi_2$), which can be deposited by CVD using a reactant gas such as tungsten hexafluoride ($WF_6$). The thickness of the polycide layer 16 is usually in the range from 500 to 3000 Angstroms. It is common practice in the industry to deposit a cap layer 18, such as $SiO_2/Si_3N_4$, on the polycide layer 16 prior to patterning the gate electrodes. The polycide layer 16, having the cap layer 18, is then patterned using conventional photolithographic techniques and anisotropic plasma etching to form the gate electrodes 16 over the device areas, one of which is shown in FIG. 1. At the same time the patterned polycide layer is used to form the word lines 16' over the field oxide 12 that electrically connect the FET gate electrodes 16 to the appropriate peripheral circuits on the DRAM chip.

Next, lightly doped source/drain regions 17(N$^-$) are formed adjacent to the gate electrodes 16 usually by implanting a N-type dopant, such as arsenic or phosphorus. For example, a typical implant might consist of a phosphorous P$^{31}$ at a dose of between 1 E 13 to 1 E 14 atoms/cm$^2$ and with an ion energy of between about 30 to 80 Kev. As is commonly used in the semiconductor industry a photolithographic mask can be used to avoid implanting in areas not requiring the implant.

After forming the lightly doped source/drain areas 17($^-$), sidewall spacers 20 are formed on the gate electrodes 16. A conformal blanket layer of $SiO_2$ is deposited and is anisotropically etched back to the substrate surface to form the sidewall spacers. For example, the $SiO_2$ can be deposited by chemical vapor deposition using tetraethoxysilane (TEOS) at a temperature in the range of between about 650 and 900° C., and the etchback can be accomplished in a reactive plasma etcher using an appropriate etchant gas such as carbon tetrafluoride ($CF_4$) and hydrogen ($H_2$). The FETs are now completed by forming heavily doped source/drain contact areas 19($N^+$), as shown in FIG. 1. For example, arsenic ($As^{75}$) can be implanted at a dose of between about 2.0 E 15 to 1.0 E 16 ions/cm$^2$ and at an implant energy of about 20 to 70 KeV.

Still referring to FIG. 1 the method for making the improved cylinder-shaped capacitors is now described. A first insulating layer 22 is deposited on the substrate to insulate the FET devices on the substrate. Layer 22 is preferably $SiO_2$, and is deposited using LPCVD and a reactant gas such as TEOS. Alternatively, layer 22 can be a borophosphosilicate glass (BPSG) deposited by LPCVD using TEOS, and is doped with boron and phosphorus during the silicon oxide deposition. The first insulating layer 22 is then planarized. For example, layer 22 can be planarized using chemical/mechanical polishing (CMP) to provide global planarization. Alternatively, if a BPSG is used, the layer can be leveled by thermal annealing. The thickness of layer 22 after planarizing is preferably between about 500 and 5000 Angstroms over the underlying FET gate electrodes 16. An etch-stop layer 24, preferably composed of silicon nitride ($Si_3N_4$), is then deposited on the first insulating layer 22. Layer 24 is preferably deposited by LPCVD using a reactant gas mixture such as dichlorosilane ($SiCl_2H_2$) and ammonia ($NH_3$), and is deposited to a preferred thickness of between about 50 and 1000 Angstroms. Next a second insulating layer 26 is deposited on the etch-stop layer 24. Layer 26 is also composed of $SiO_2$ or BPSG, and is deposited by LPCVD to a preferred thickness of between about 500 and 10000 Angstroms, and a polish-back endpoint detect layer 28, composed of $Si_3N_4$, is deposited on the second insulating layer 26. Layer 28 is deposited by a method similar to the deposition of $Si_3N_4$ layer 24, and is deposited to a preferred thickness of between about 50 and 1000 Angstroms.

Still referring to FIG. 1, conventional photolithographic techniques are used to make a photoresist mask 30 for making first openings aligned over a source/drain contact region in each of the device areas (memory cell areas). Photoresist mask 30 is then used as an etch mask to etch openings that will eventually form the node contact openings for the capacitors.

Figure 2:
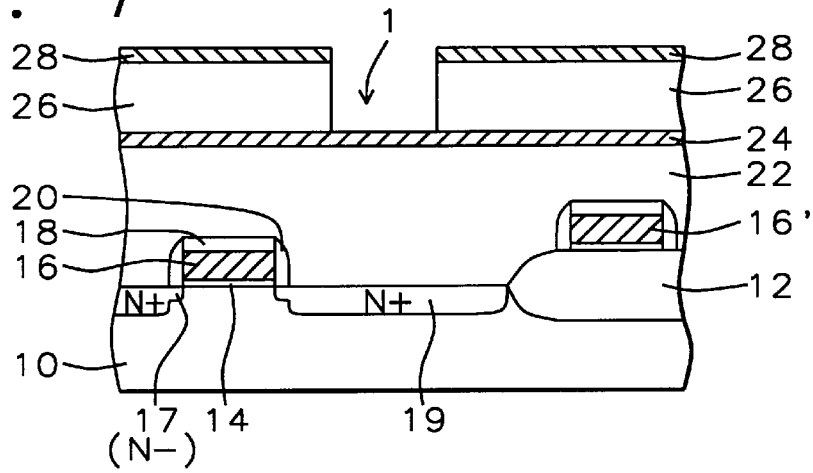

Referring now to FIG. 2, the first openings 1 are etched initially in the polish-back endpoint detect layer 28 and the second insulating layer 26, while the etch-stop layer 24 serves as an etch stop to accurately control the etch depth. This avoids a timed etch in which a controlled etch depth is difficult to achieve repeatedly. The preferred etch is an anisotropic plasma etch having a high etch-rate selectivity between the $SiO_2$ second insulating layer 26 and the $Si_3N_4$ etch-stop layer 24. By way of example, the etching of the polish-back endpoint detect layer 28 can be carried out in a reactive ion etcher (RIE), a high-density plasma (HDP) etcher and the like, and an etchant gas such as carbon tetrafluoride ($CF_4$) or trifluoromethane ($CHF_3$) where the etch-rate selectivity of the polish-back endpoint detect layer 28 to the second insulating layer 26 is not critical. The etching of the first openings 1 in the second insulating layer 26 is then continued to the etch-stop layer 24. The second insulating layer is etched preferably in a HDP etcher using an etchant gas mixture that provides a high-etch selectivity of $SiO_2$ to $Si_3N_4$ to accurately control the etch depth. This provides a more repeatable and reliable process. For example, the etch selectivity of the $SiO_2$ to $Si_3N_4$ is preferably greater than 20:1. More specifically, this high etch-rate selectivity can be achieved using a high-density plasma etcher, such as Model MxP+, manufactured by Applied Materials Company of the USA, and using an etching gas mixture of perfluoroisobutylene ($C_4F_8$), $CHF_3$, $CF_4$ and carbon nonoxide (CO). The photoresist mask 30 is then removed using, for example, plasma ashing in oxygen ($O_2$).

Figure 3:
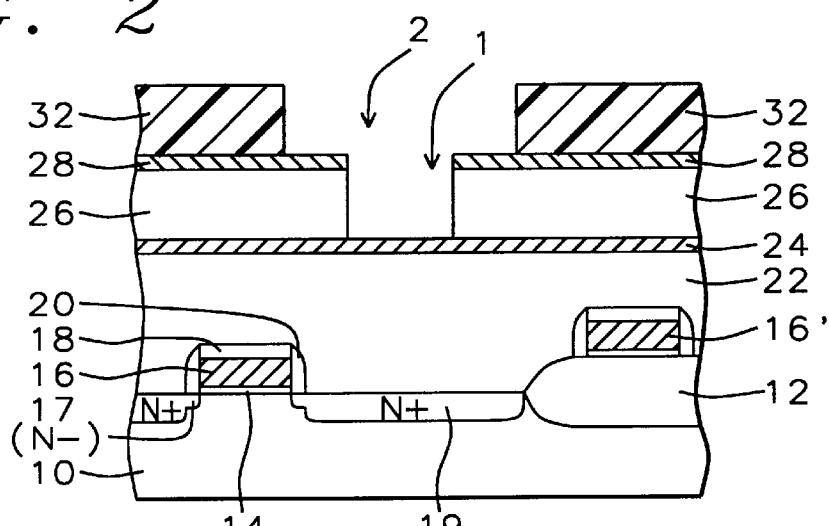
Figure 4:
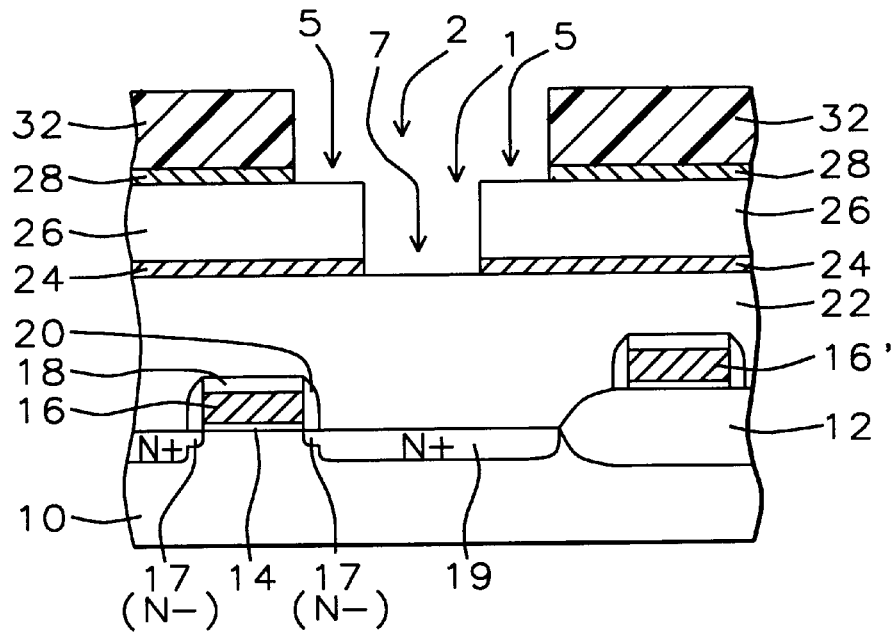
Figure 5:
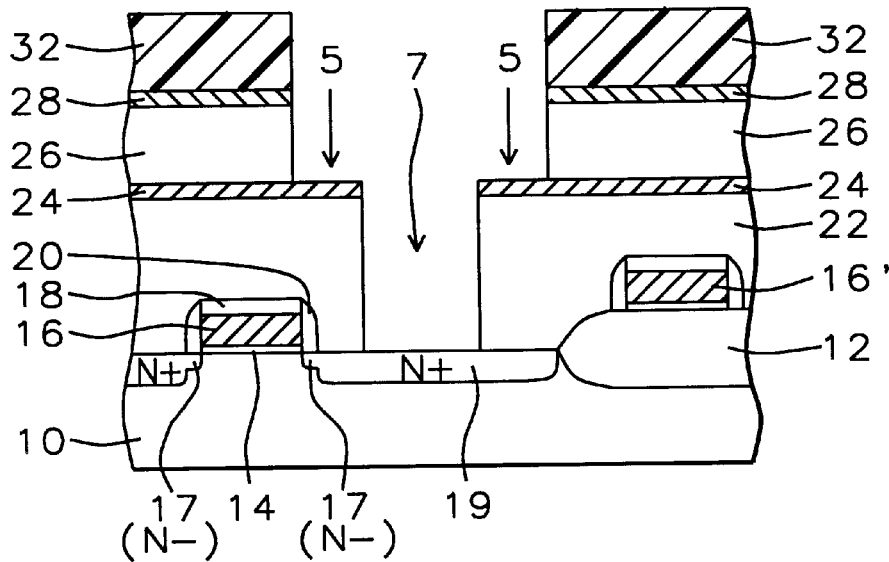

Referring now the FIG. 3, a patterned second photoresist mask 32 is used to etch second openings 2 that are wider in diameter and aligned over the first openings 1, as depicted in FIGS. 4 and 5. The same sequence of etching steps is carried out for this etching as is used for the etching of the first openings 1, depicted in FIG. 2. The exposed polish-back endpoint detect layer 28 in the second openings 2 is etched to the second insulating layer 26, as depicted by the vertical arrows 5. Concurrently the exposed etch-stop layer 24 in the first openings 1 is removed by the same etching, as depicted by the vertical arrow 7, to expose the underlying first insulating layer 22.

Now as shown in FIG. 5, the second insulating layer 26 exposed in the second openings 2 is accurately etched to the etch-stop layer 24, while concurrently etching the first insulating layer 22 in the first openings 1 to the device areas to complete the capacitor node contact openings to the source/drain regions 17($N^-$). The etching is carried out using, for example, a HDP etcher and an etchant gas mixture of $CF_4$ and $CHF_3$. The second photoresist mask 32 is then removed by plasma ashing in $O_2$.

Figure 6:
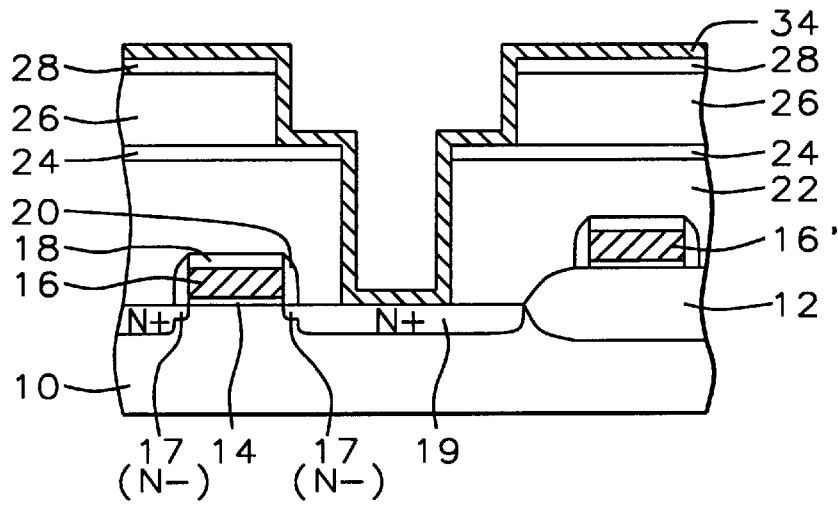

Referring to FIG. 6, the bottom electrodes for the stacked capacitors are formed next. A conformal first polysilicon layer 34 is deposited. Layer 34 is deposited preferably by LPCVD using $SiH_4$ as the reactant gas, and is in-situ doped, preferably with an N-type dopant such as phosphine ($PH_3$) to a concentration of between about 1.0 E 17 and 1.0 E 21 atoms/cm$^3$. Layer 34 is deposited to a thickness of between about 100 and 5000 Angstroms. The conformal deposition of polysilicon layer 34 in the second openings 2 forms the bottom electrodes having vertical sidewalls for the capacitor, while concurrently forming the capacitor node contacts in the first openings 1.

Figure 7:
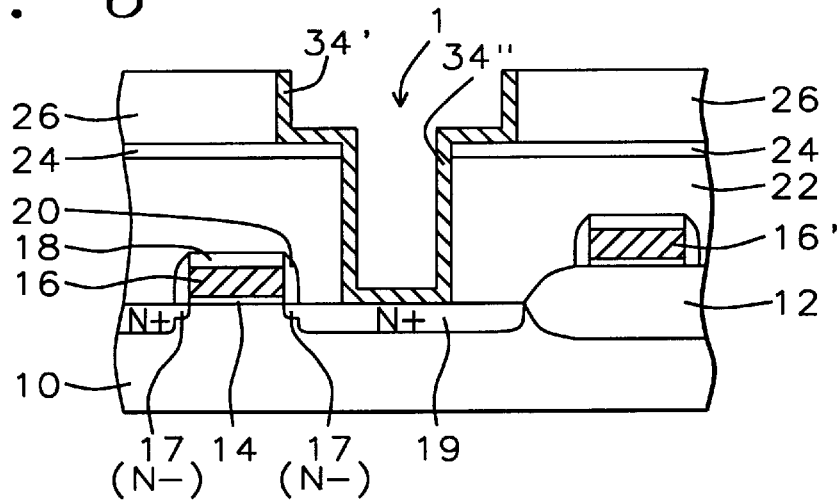

Referring next to FIG. 7, the first polysilicon layer 34 and the polish-back endpoint detect layer 28 are then chemically/mechanically polished back to the second insulating layer 26. Alternatively, the polysilicon layer 34 can be polished back to the polish-back endpoint detect layer 28 and layer 28 can be removed selectively in a hot phosphoric acid etch. The chemically/mechanical polishing results in an array of bottom electrodes having vertical sidewalls 34' and capacitor node contacts 34", which are formed from a single polysilicon layer, as shown in FIG. 7. The polish-back endpoint detect layer 28 is optional, but is preferred to prevent overpolishing the polysilicon layer 34 that can cause sharp corners in the vertical sidewall 34' that can later result in higher leakage currents between the capacitor bottom and top electrodes.

Figure 8:
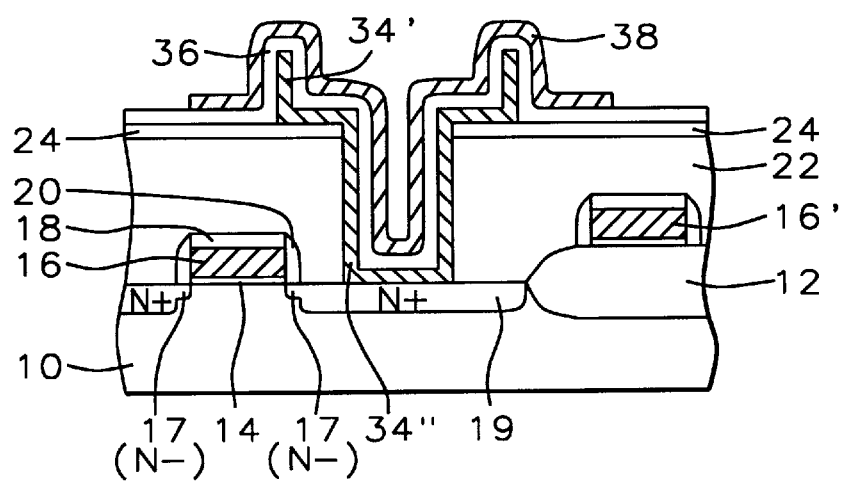

Referring now to FIG. 8, the second insulating layer 26 is removed by isotropic etching in a hydrofluoric (HF) acid etch solution to provide an array of free-standing polysilicon bottom electrodes. The silicon nitride etch stop layer 24 prevents wet etching of the underlying first insulating layer 22 that can otherwise cause reliability problems. Since the conformal first polysilicon layer 34" does not completely fill the first openings 1 (node contact openings), the capacitor surface area is further increased to increase the capacitance.

Still referring to FIG. 8, the array of capacitors is now completed by depositing a thin interelectrode dielectric layer 36, having a high dielectric constant, over the capacitor bottom electrodes 34'. A second polysilicon layer 38 is then deposited and patterned to form the top electrodes on the cylinder-shaped stacked capacitors. The thin interelectrode dielectric layer 36 is formed on the surface of the array of bottom electrodes (not depicted as a separate layer in FIG. 8). The thin dielectric layer 36 is preferably between about 30 and 300 Angstroms thick, and is composed of a material having a high dielectric constant that is compatible with the polysilicon processing, and is continuous and pin-hole free. The preferred interelectrode dielectric layer is composed of silicon oxide-silicon nitride (ON) or a silicon oxide-silicon nitride-silicon oxide (ONO) layer. For example, the surface of the polysilicon bottom electrode can be thermally oxidized to form the silicon oxide, and then a thin conformal silicon nitride layer can be deposited using LPCVD to form the ON layer. To form the ONO layer, the exposed surface of the $Si_3N_4$ layer can then be reduced in an oxidizing ambient at elevated temperatures. Additionally, the surface of the polysilicon bottom electrodes 34' formed from layer 34 can also be roughened by wet etching to further increase the surface area and the capacitance. Alternatively, other high-dielectric constant insulators can be used, such as tantalum pentoxide ($Ta_2O_5$) and the like.

A conformal second polysilicon layer 38 is deposited over the thin interelectrode dielectric layer 36, and then patterned using conventional photolithographic and plasma etching techniques to form the top electrodes 38, and thereby complete the stacked capacitor structure. The polysilicon layer 38 is preferably deposited by LPCVD to a thickness of between about 200 and 2000 Angstroms, and is in-situ doped with an N-type dopant, such as phosphorous (P), having a preferred concentration in the range of between about 1.0 E 19 to 1.0 E 21 atoms/cm$^3$.

While the invention has been particularly shown and described with reference to the preferred embodiment thereof, it will be understood by those skilled in the art that various changes in form and detail may be made without departing from the spirit and scope of the invention. Although the formation of the bit lines is not described, it should also be understood that the process for making the cylinder-shaped stacked capacitor is compatible with the capacitor-over-bit line (COB) or the capacitor-under-bit line (CUB) technologies.

What is claimed is:

1. A method for fabricating cylinder-shaped stacked capacitors for memory devices comprising the steps of:

providing a semiconductor substrate having device areas with semiconductor devices;

forming a planar first insulating layer over said device areas on said substrate;

depositing an etch-stop layer on said planar first insulating layer;

depositing a second insulating layer on said etch-stop layer;

depositing a polish-back endpoint detect layer on said second insulating layer;

selectively etching first openings in said polish-back endpoint detect layer and said second insulating layer to said etch-stop layer aligned over said device areas for capacitor node contact openings;

selectively etching second openings, aligned over and wider than said first openings, in said polish-back endpoint detect layer, and concurrently removing by etching said etch-stop layer in said first openings to said first insulating layer;

selectively etching said second insulating layer in said second openings to said etch-stop layer, and concurrently etching said first insulating layer in said first openings to said device areas to complete said capacitor node contact openings;

depositing a conformal first polysilicon layer over and in said second and first openings, and concurrently forming capacitor node contacts in said first openings and bottom electrodes in said second openings for said cylinder-shaped capacitors;

polishing back said first polysilicon layer and said polish-back endpoint detect layer to said second insulating layer;

isotropically etching said second insulating layer selectively to said etch-stop layer to form said bottom electrodes;

depositing an interelectrode dielectric layer on said bottom electrodes;

depositing and patterning a second polysilicon layer to form top electrodes and completing said cylinder-shaped capacitors.

2. The method of claim 1, wherein said first insulating layer is silicon oxide, and has a thickness in the range between about 500 and 5000 Angstroms.

3. The method of claim 2, wherein said etch-stop layer is a silicon nitride layer, and has a thickness in the range between about 50 and 1000 Angstroms.

4. The method of claim 1, wherein said second insulating layer is silicon oxide, and has a thickness in the range between about 500 and 5000 Angstroms.

5. The method of claim 1, wherein said polish-back endpoint detect layer is a silicon nitride layer, and has a thickness in the range between about 50 and 1000 Angstroms.

6. The method of claim 1, wherein said conformal first polysilicon layer is doped with conductive impurities to a concentration of between about 1.0 E 17 and 1.0 E 21 atoms/cm$^3$.

7. The method of claim 1, wherein said conformal first polysilicon layer has a thickness of between about 500 and 3000 Angstroms.

8. The method of claim 4, wherein said second insulating layer composed of silicon oxide is removed in a hydrofluoric (HF) acid etch.

9. The method of claim 1, wherein said interelectrode dielectric layer is a layer of silicon oxide, a layer of silicon nitride, and a layer of silicon oxide (ONO), and said interelectrode dielectric layer has a thickness of between about 30 and 300 Angstroms.

10. The method of claim 1, wherein said second polysilicon layer is doped with a conductive impurities to a concentration of between about 1.0 E 17 and 1.0 E 21 atoms/cm$^3$, and has a thickness of between about 500 and 3000 Angstroms.

11. A method for fabricating dynamic random access memory cells having cylinder-shaped stacked capacitors comprising the steps of:

providing a semiconductor substrate having device areas;

forming field effect transistors (FETs) having source/drain regions in said device areas surrounded and electrically isolated by field oxide regions;

forming a planar first insulating layer over said device areas on said substrate;

depositing an etch-stop layer on said planar first insulating layer;

depositing a second insulating layer on said etch-stop layer;

depositing a polish-back endpoint detect layer on said second insulating layer;

selectively etching first openings in said polish-back endpoint detect layer and said second insulating layer to said etch-stop layer aligned over one of each said source/drain areas in each of said device areas for capacitor node contact openings;

selectively etching second openings, aligned over and wider than said first openings, in said polish-back endpoint detect layer, and concurrently removing by etching said etch-stop layer in said first openings to said first insulating layer;

selectively etching said second insulating layer in said second openings to said etch-stop layer, and concurrently etching said first insulating layer in said first openings to said device areas to complete said capacitor node contact openings to said source/drain regions;

depositing a conformal first polysilicon layer over and in said second and first openings, and concurrently forming capacitor node contacts in said first openings and bottom electrodes in said second openings for said cylinder-shaped capacitors;

polishing back said first polysilicon layer to said polish-back endpoint detect layer and selectively removing said polish-back endpoint detect layer over said second insulating layer;

isotropically etching said second insulating layer selectively to said etch-stop layer to form said bottom electrodes;

depositing an interelectrode dielectric layer on said bottom electrodes;

depositing and patterning a second polysilicon layer to form top electrodes and completing said dynamic random access memory cells having said cylinder-shaped capacitors.

12. The method of claim 11, wherein said first insulating layer is silicon oxide, and has a thickness in the range between about 500 and 5000 Angstroms.

13. The method of claim 11, wherein said etch-stop layer is a silicon nitride layer, and has a thickness in the range between about 50 and 1000 Angstroms.

14. The method of claim 11, wherein said second insulating layer is silicon oxide, and has a thickness in the range between about 500 and 5000 Angstroms.

15. The method of claim 11, wherein said polish-back endpoint detect layer is a silicon nitride layer, and has a thickness in the range between about 50 and 1000 Angstroms.

16. The method of claim 11, wherein said conformal first polysilicon layer is doped with conductive impurities to a concentration of between about 1.0 E 17 and 1.0 E 21 atoms/cm$^3$, and has a thickness of between about 500 and 3000 Angstroms.

17. The method of claim 15, wherein said silicon nitride polish-back endpoint detect layer is selectively removed in a hot phosphoric acid ($H_3PO_4$) etch.

18. The method of claim 14, wherein said second insulating layer composed of silicon oxide is removed in a hydrofluoric (HF) acid etch.

19. The method of claim 11, wherein said interelectrode dielectric layer is a layer of silicon oxide, a layer of silicon nitride, and a layer of silicon oxide (ONO), and said interelectrode dielectric layer has a thickness of between about 30 and 300 Angstroms.

20. The method of claim 11, wherein said second polysilicon layer is doped with a conductive impurities to a concentration of between about 1.0 E 17 and 1.0 E 21 atoms/cm$^3$, and has a thickness of between about 500 and 3000 Angstroms.

* * * * *